United States Patent [19]

Wittes

[11] Patent Number: 4,781,960

[45] Date of Patent: Nov. 1, 1988

[54] STRUCTURE FOR MOUNTING INDICATOR LIGHTS ON A PRINTED CIRCUIT BOARD, AND MANUFACTURING METHOD

[75] Inventor: James M. Wittes, Linden, N.J.

[73] Assignee: Industrial Devices, Inc., Edgewater, N.J.

[21] Appl. No.: 20,075

[22] Filed: Feb. 27, 1987

[51] Int. Cl.[4] .......................... B32B 3/12; H05K 7/02; H05K 7/10; H01R 9/00
[52] U.S. Cl. ..................................... 428/119; 428/209; 428/901; 361/400; 361/403; 361/405
[58] Field of Search ......................... 361/400, 403, 405; 428/35, 119, 209, 901

[56] References Cited

U.S. PATENT DOCUMENTS

| 3,912,984 | 10/1975 | Lockhart, Jr. et al. | 361/400 |
| 4,667,270 | 5/1987 | Yasi | 361/380 |
| 4,673,967 | 6/1987 | Hingorany | 357/70 |

FOREIGN PATENT DOCUMENTS 2747272 4/1979 Fed. Rep. of Germany ...... 361/400

OTHER PUBLICATIONS

Light Emitting Diode Mounting Block, Chatlou et al., IBM Tech. Discl. Bulletin, vol. 15, No. 1, 6-72, p. 48.
Coaxial Cable to Printed Circuit Board Connector, Agard et al., IBM Tech. Discl. Bull., Vol. 13, No. 6, 11-70, p. 1595.
"Surface Mount Technology Handbook", by Molex, Pub. 1986.
"The Source for Indicator Lights" by Industrial Devices, Inc., Pub. 1986; pp. 48, 49 and 59.

Primary Examiner—John E. Kittle
Assistant Examiner—P. J. Ryan
Attorney, Agent, or Firm—Gregor N. Neff

[57] ABSTRACT

The indicator light, preferably a LED, is mounted in a insulating housing secured by a pair of legs with relatively broad feet which are soldered to conductive pads on the surface of a printed circuit board. Preferably, the printed circuit board uses "surface mount" technology. The leads of the LED are spot welded to the legs to make electrical connections between the LED and the circuit board. The structure elevates the LED above the board surface, and/or allows mounting the LED close to the edge of the circuit board, and/or allows the light from the LED to be directed parallel to the board surface. A particularly advantageous use of the structure is one in which printed circuit boards are arranged in an array with the boards parallel to one another and the LED mounting structures near the end of each board so as to provide maximum visibility of the LEDs from many angles so as to quickly indicate equipment functional status to an operator or trouble-shooter. In the manufacturing method, the leg structures are stamped and formed along the edge of a pre-plated and selectively solder-coated strip, with prongs being formed on each leg. The prongs then are pushed into recesses in a plastic body. The LED is inserted and the leads are spot welded to the legs. Then, the assembly is broken off of the strip along a previously formed breakline.

20 Claims, 3 Drawing Sheets

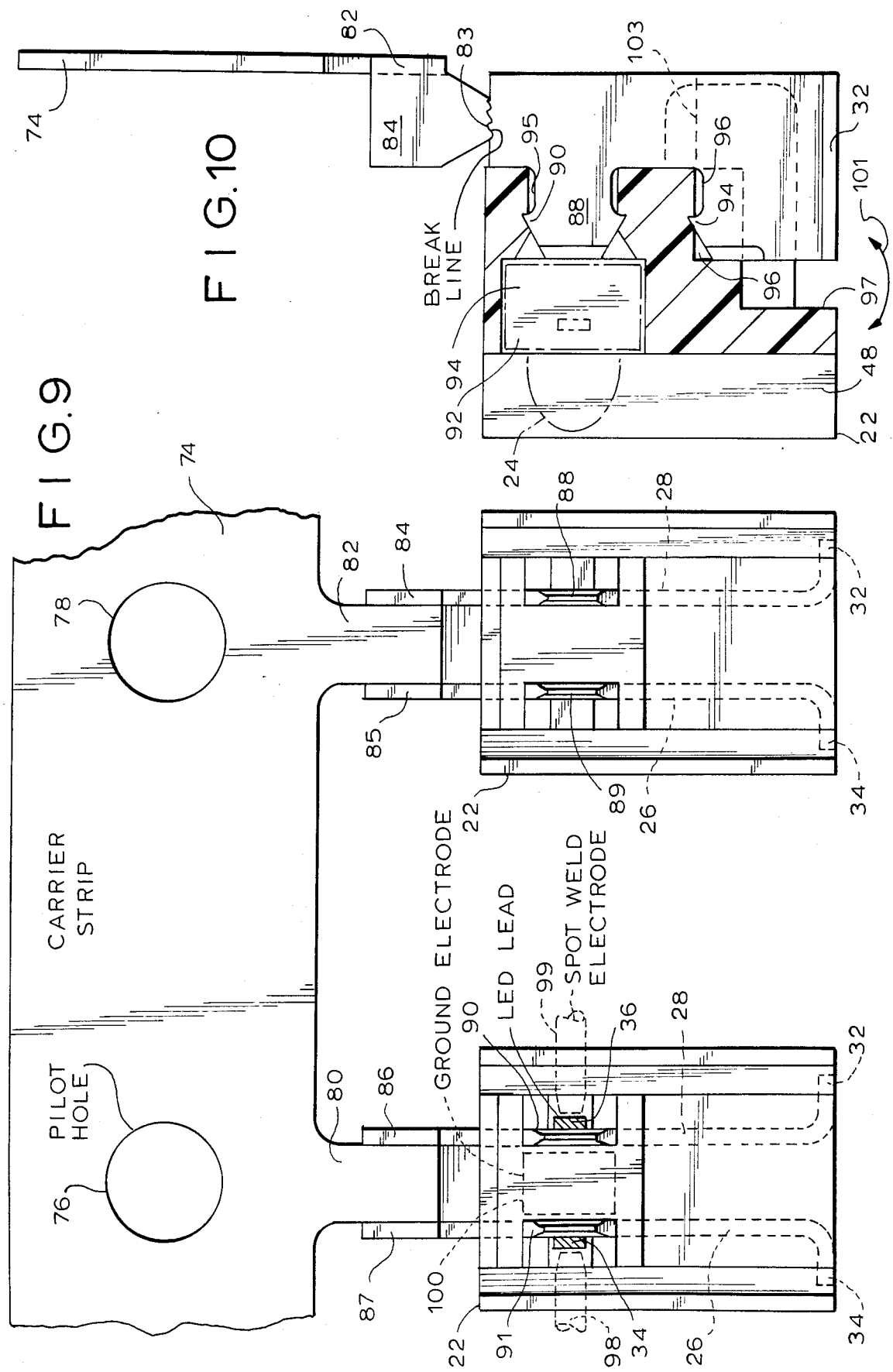

STRUCTURE FOR MOUNTING INDICATOR LIGHTS ON A PRINTED CIRCUIT BOARD, AND MANUFACTURING METHOD

This invention relates to structures for mounting indicator lights on printed circuit boards, and particularly relates to structures for mounting light-emitting diodes ("LEDs") on printed circuit boards using "surface mount" technology.

Printed circuit boards using "surface mount" technology have several advantages over prior printed circuit boards. In "surface mount" circuit boards, "through holes" for making electrical interconnections or for other purposes are largely or completely eliminated. Instead, circuitry is packed closely together, and the space usually required for through holes is utilized more efficiently, so that the boards can be smaller though carrying the same amount of circuitry. Furthermore, the components mounted on the circuit boards can be smaller and less expensive than those used on conventional printed circuit boards.

Surface mount technology creates certain problems. Since the printed conductors and components must be located closer together than with other printed circuit boards, greater accuracy in the location of devices and conductors on the boards is required. Furthermore, since "wave soldering" usually is not used, radiant heating in a oven or the like usually is used to heat the components and their leads so as to cause the pre-applied solder to melt and attach the components to the board. The more demanding requirements of surface mount technology place greater demands on the structures and techniques for mounting components, indicator lights, etc., on the surface boards.

Often it is necessary to mount indicator lights such as LEDs on a printed circuit board with the light elevated above the surface of the board, or with the LED near to one edge of the board. Each of these requirements creates special problems in the mounting of the LEDs.

The mounting of circuit components on surface mount boards often is accomplished simply by cutting the electrical lead conductors of the devices and bending the conductors to a proper shape, and then soldering them to the pads onto which the devices are to be mounted. This technique also has been used to mount LEDs on surface mount boards. However, when the LED must be elevated above the board, or where it must be used close to the edge of a board and it is desired for it to extend out to or beyond the edge of the board, such prior techniques are not satisfactory. The leads usually provided for LEDs tend to be too pliable and narrow to support and accurately locate the LED very high off the board. Furthermore, there usually is a margin area near the edges of the board which is free of circuitry. This makes it difficult or impossible to mount the LEDs very near the edges of the circuit board.

Accordingly, it is an object of the present invention to provide a structure for mounting indicator lights, particularly LEDs, on printed circuit boards, particularly surface mount boards, with strength, accuracy and variability in positioning.

It is a further object of the invention to provide such a structure in which an indicator light can be mounted a substantial distance above the surface of the board and/or near one edge so that it can be seen more easily, and whenever required for any other reason.

It is another object to provide an array of printed circuit boards with one edge aligned and visible, each having one or more indicator lights or LEDs mounted near the edge with the LEDs being visible from a wide number of different angles.

It is a further object of the invention to provide a mounting structure with relatively broad conductive support surfaces for attachment to conductive pads on the boards with a high degree of accuracy and precision, and mechanical strength.

It is a still further object to provide such a structure which is well adapted to precise positioning on surface mount boards by the use of automated positioning equipment.

It is another object to provide such a structure which is relatively compact and inexpensive to manufacture, and to provide a relatively fast and inexpensive method of manufacturing such a structure.

The foregoing objects are met, in accordance with the present invention, by the provision of a mounting structure having an electrically insulating body secured to a pair of electrically conductive support legs with relatively broad feet. The light source, e.g., LED, is mounted in the insulating body and its leads are connected to the conductive legs. The use of the strong legs with the relatively broad feet enables the feet to be soldered to the surface of the board and thus to hold the indicator light securely in place without using through holes to fasten the structure to the board.

The structure can be used to elevate the indicator light or LED above the surface of the board by a substantial distance, and/or to extend the position of the LED laterally from the support feet contacts so that the LED can extend to a position near the edge of the circuit board. This provides excellent visibility from a wide variety of angles when the circuit boards are viewed from one edge. The indicator lamp also can be positioned so as to shine its light principally in a direction parallel to the circuit board, if desired. In general, the structure allows the use of a great variety of positions and orientations for the indicator light or lamp.

Preferably, the device is manufactured by stamping the leg structures at spaced positions along one edge of a metal strip or ribbon. Preferably, each of the legs has prongs extending outwardly, and a plastic body is provided with recesses to receive the prongs. The body is positioned opposite the prongs and the parts are pressed together to provide an interference fit and precise location of the legs with respect to the body. The LED is inserted in a recess in the body, and the leads preferably are spot-welded to the legs. Preferably, this is all done while the legs and feet are still attached to the strip so as to keep them in alignment during and after the manufacturing process and facilitate transfer of the assemblies from one manufacturing and testing operation to another. The assemblies are then broken off the strip at previously prepared break points.

The construction of the mounting structure allows one to raise LEDs over other components on the printed circuit board such as integrated circuit chips, or to locate the light-emitting portions of the structures near the edges of the printed circuit boards where there are no conductive pads.

The structure provides a strong, dimensionally stable and accurate support for LEDs on surface mount boards and standard boards as well. The structure is compact and versatile, allowing, for example, two of the units to be mounted with respect to one another in piggy-back fashion.

The foregoing and other objects and advantages of the invention will be set forth in or apparent from the following description and drawings.

In the drawings:

FIG. 9 is a partially broken away and partially schematic top plan view of a carrier strip and a pair of the mounting structures during the preferred process for manufacturing them;

FIG. 10 is a side elevation view of the structure of FIG. 9, partially in cross section with the section being taken along line 10—10 of FIG. 6.

Figure 1:
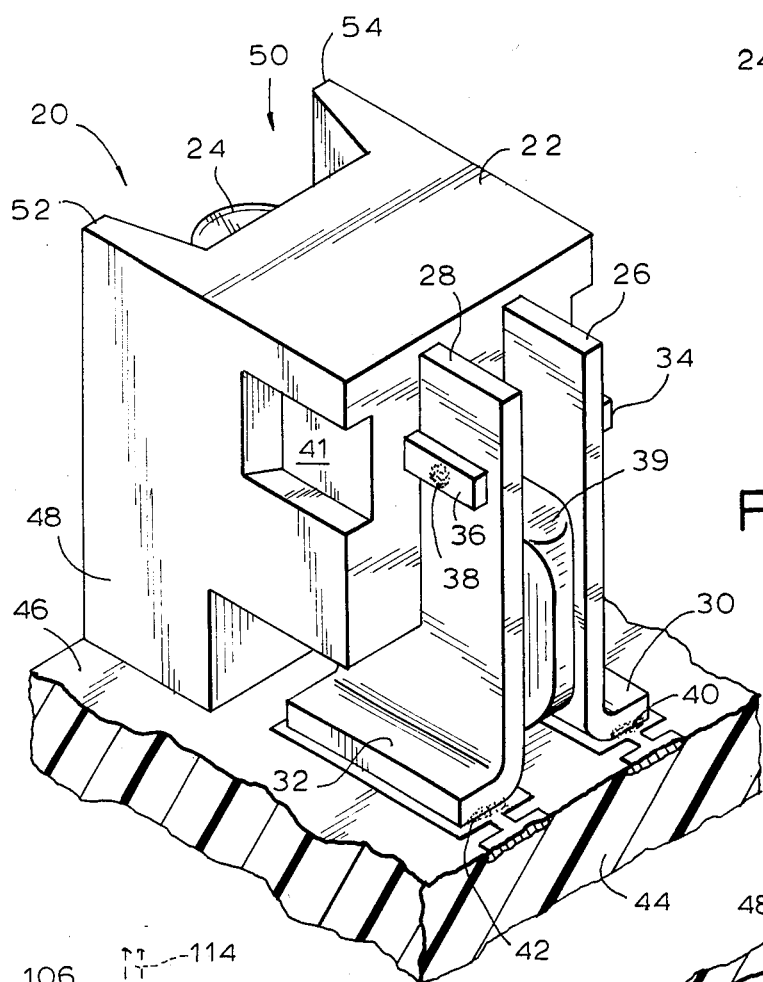
FIG. 1 is a perspective, partially broken away view of a indicator lamp mounting structure constructed in accordance with the present invention.

The preferred indicator lamp mounting structure 20 is shown in FIG. 1. The structure 20 includes a molded plastic insulating body member 22, a LED whose lens 24 is visible in FIG. 1, and two L-shaped legs 26 and 28, each having a relatively broad foot portion 30 or 32, respectively.

The foot portions 30 and 32 are soldered to conductive mounting pads 40 and 42, respectively, on the surface of a surface mount printed circuit board 44.

Figure 4:
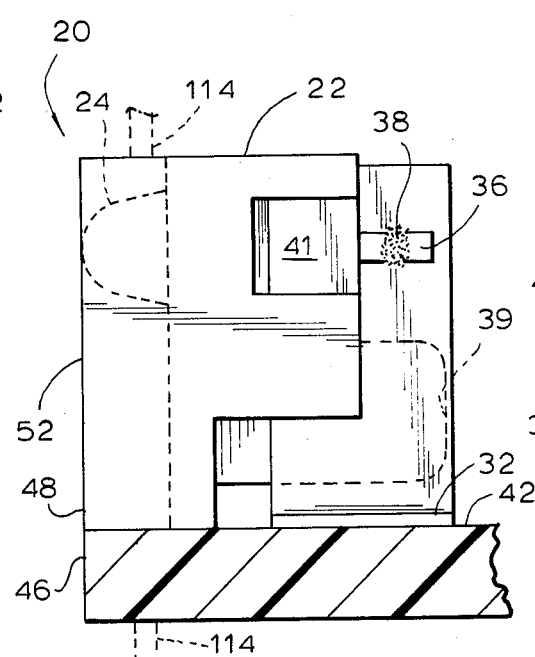
FIG. 4 is a side elevation view of the mounting structure shown in FIG. 1.
Figure 8:
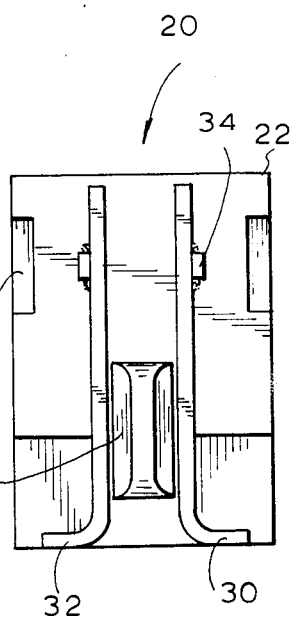

A portion 48 of the body 22 extends laterally from the legs and contacts the board surface, as it is shown more clearly in FIG. 4. The left edge of the portion 48 is approximately flush with the front edge 46 of the printed circuit board 44, as it also is shown in FIGS. 1 and 4.

Figure 6:
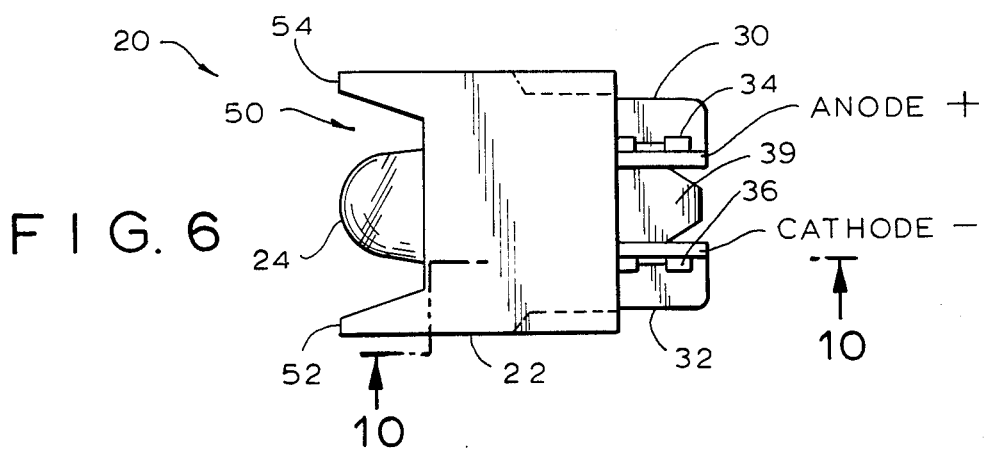
FIGS. 5, 6, 7 and 8 are, respectively, a bottom plan view; a top plan view; a front elevation view; and a rear elevation view of the structure shown in FIG. 4.
Figure 7:
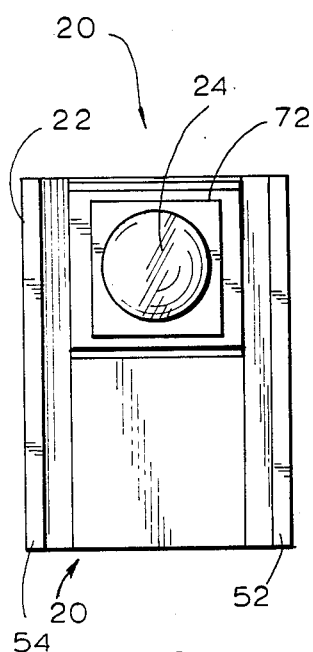
Figure 5:
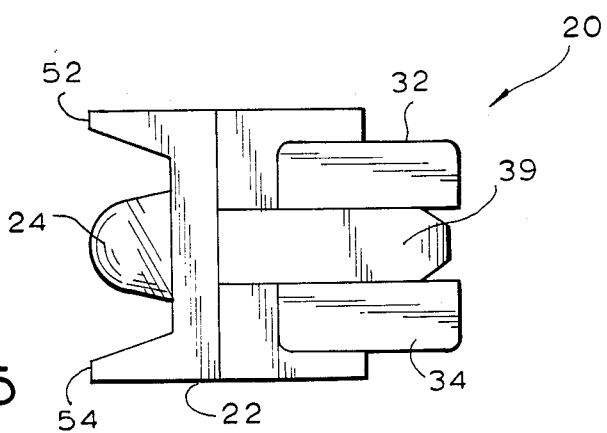

The LED lens 24 and the LED device itself both are located in a recess 50 in the body portion 22. The recess is of trapezoidal cross-section, as it is shown in FIGS. 1, 5 and 6. Edges 52 and 54 form the front edges of the body 22. The lens 24 is directed so as to shine light in a principal direction parallel to the surface of the circuit board 44.

As it can be see in FIGS. 5 and 6, the edges 52 and 54 extend just beyond the outermost tip of the lens 24 so as to protect it, and also so as to give the body 22 a generally rectangular outline so that it can be readily turned and squared by a squaring mechanism for aligning the device properly before it is located on the surface of the printed circuit board by high precision automatic locating equipment for mounting components on the circuit boards.

As it is shown in FIGS. 1, 4, 5, 6 and 8, a spacer 39 which is a part of the insulating body 22 is positioned between the legs 26 and 28 to keep the legs spaced apart accurately. Recesses 41 in the sides of the body 22 are created during the molding process used to mold the plastic body 22.

Figure 2:
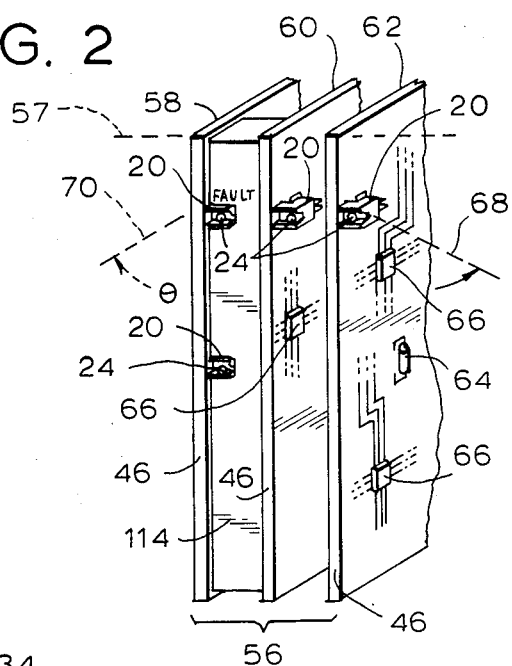
FIG. 2 is a perspective, partially broken away view of an array of surface mount printed circuit boards bearing indicator lamp structures near their edges.

FIG. 2 shows an array 56 of three surface mount printed circuit boards 58, 60 and 62 which are mounted in a rack structure indicated schematically at 57, with the boards parallel to one another and with the edges extending outwardly towards maintenance or operating personnel who need to see the LED indicator lamps to determine whether any of the lamps 20 mounted on the boards is lit, thus indicating operational status (e.g., malfunction) of that board. Each of the boards has substantial quantities of integrated circuit chips 66, resistors 64, and printed circuitry on the surface, only some of which are shown schematically in FIG. 2.

Actually, two of the LED lamps 20 are mounted on each board, as shown on the board 58, and a front panel 114 is mounted on the board recessed slightly from the edges and having cut-outs through which the LED lamps 20 can be seen. The upper lamp 20 is located near the word "FAULT" on the panel, and glows red. The lower lamp is near the word "OK" and glows green. Similar panels 114 are located between the other boards, and other lamps 20 are located on those boards below the ones shown. However, those other lamps and panels 114 are omitted from FIG. 2 for the sake of clarity of the drawings.

Because the mounting structure of the present invention allows the LED devices to extend up to or beyond the edges 46 of the boards, the LEDs can be seen from a wide angle $\theta$, indicated by the lines 68 and 70 in FIG. 2, relatively unobstructed by the board edges.

Figure 3:
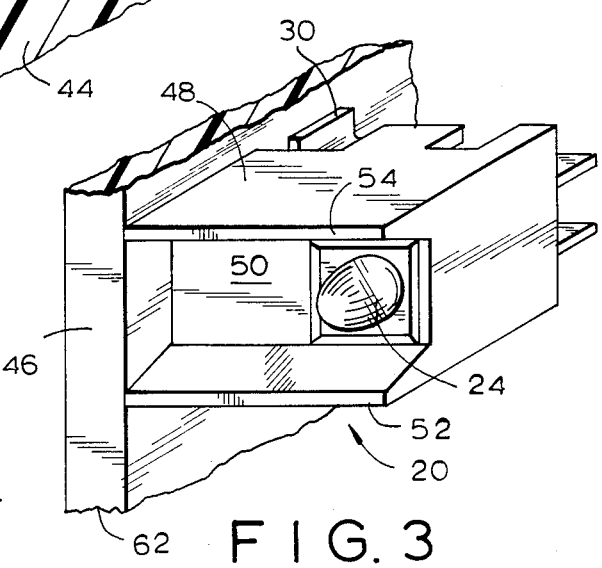
FIG. 3 is an enlarged view of one of the indicator lamp structures of FIG. 2.

FIG. 3 is an enlarged view of one of the devices 20 mounted on the edge of one of the printed circuit boards 62, with the panel 114 omitted. FIG. 3 shows how the tip of the lens 24 of the LED extends almost up to the edge 46 of the circuit board so that the lamp can be seen from a wide variety of different angles, thus greatly facilitating maintenance and monitoring of the circuits on the boards. The edges 52 and 54 of the housing which protect the lamp form a channel which is open at either end, thus further facilitating viewing of the LED from the side. The fact that the LED is spaced a substantial distance from the board 62 further enhances the viewability of the LED because it is not hidden behind the edge 46 of the board.

As it will be explained in greater detail below, the feet 30 and 32 which are to be attached to the pads 40 and 42 on the printed circuit board 44 are pre-soldered with a thin coating of solder. The pads 40 and 42 usually will be pre-soldered also, and will be coated with a layer of solder paste comprising a tacky mixture of solder and flux. When the feet 30 and 32 are pressed against the pads, they adhere to the pads due to the adhesive power of the solder paste.

When all of the components on the board have been thus mounted, the whole board assembly is subjected to radiant and/or convection heating in an oven to reflow the solder on the pad and the feet and form a strong, mechanically sound and electrically complete connection of the indicator lamp structure to the circuitry on the surface mount board.

The broad surface area of the feet 30 and 32 and the additional support due to contact of the body 22 with the board in the vicinity of the portion 48 secures the LED to the board with strength and stability, despite the inability to use through holes.

The preferred method for manufacturing and details of the internal construction of the body 22 and the legs 26 and 28 are shown in FIGS. 9 and 10. FIG. 9 shows a portion of a thin metal carrier strip 74 having a plurality of pilot holes 76, 78, etc., along its length. Aligned with each pilot hole is a leg structure which has been formed by stamping and bending. The leg structures are attached at spaced intervals opposite the pilot holes by means of a projection 80, 82, etc., and bent-over tab portions 84, 85, 86 and 87.

The structure of each leg 26 or 28 is shown in FIG. 10. It is formed of metal from the carrier strip by first stamping the shape shown in FIG. 10, and then bending the metal to form the foot portions 32 and 34, then bending the leg structures perpendicular to the strip.

Each leg has a barbed prong 88 and a second portion which also is barbed at 94. The body portion 22 has recesses 95 and 96 into which the barbed prongs make an interference fit.

The body portion 22 is formed out of high temperature-resistant thermoplastic material, preferably a fiberglass reinforced polyphenylene sulfide material such as that sold under the trademark "Ryton" by Phillips Petroleum Company. Such material is structurally and dimensionally stable when subjected to the high temperatures used in heating the printed circuit board assemblies to make the desired soldered connections.

As it can be seen in FIG. 9, when the legs and feet have been bent, they are still attached together solidly by the metal projection 80 fastening the portions 86 and 87 together. Similarly, as it is shown in the right hand portion of FIG. 9 the projection 82 attaches the portions 84 and 85 together.

As is shown in FIG. 10, each of the portions 84-87 is notched to define a break line at 83.

The plastic housing is assembled onto the legs by inserting the prongs 88 with their barbs into the recesses in the body 22 and pressing the body and prongs together. The plastic material deforms and the barbs become imbedded in the plastic material to hold the legs securely to the body. Then, the LED device 94 (see FIG. 10) is inserted into a rectilinear cavity 92 with the leads 34 and 36 (see left portion of FIG. 9) extending through holes in the body 22 so that the leads 34 and 36 are near the legs 26 and 28. Then, a ground electrode 100 is inserted into the space between the legs 26 and 28, and first one spot welding electrode 96, and then another spot welding electrode 98 contact the lead conductors 36 and 34 to spot weld them successively to each leg.

When this has been done, the mounting structure is completed, and the finished structure is removed from the carrier strip by simply rotating the assembly shown in FIG. 10 as indicated by the arrow 101 so as to break the structure free from the tabs 84, 85, etc., along the break line 83 and remove the structure from the carrier strip.

The carrier strip 74 preferably is made of a relatively high strength metal of adequate conductivity such as copper-nickel alloy number 725.

Before the strip 74 is stamped, the strip is nickel-plated and then the lower edge is coated with solder in order to pre-solder the feet 32 and 34. Preferably, the solder is applied by printing or dipping rather than electro-coating to ensure obtaining the most reliable reflowed solder connection when heated during the assembly process for attaching components to the circuit board.

The finished devices preferably are oriented and packaged in compartments formed in a plastic carrier strip. The compartments are sealed with a flat plastic cover tape. One device is located in each compartment and the tape is wound on a reel for shipment to the user.

In a typical method of using the device, the plastic cover tape is peeled off, and a vacuum device picks up the LED structure out of the compartment, orients it in a particular direction with a squaring device, then positions it accurately on the mounting pads. The rectilinear outside shape of the housing facilitates the operation of the squaring device.

The LEDs used can be any of a number of devices such as subminiature LEDs sold by Hewlett-Packard Corporation in red, green and yellow colors. For example, the red LED has part number HLMP7000, and the green LED number HLMP7040, and the yellow LED has number HLMP7019.

It should be noted that the front edges of the prongs 88 and 89, and the portion of the leg near reference numeral 96 in FIG. 10 is beveled so as to facilitate insertion of the prongs into the housing and guide the LED leads past the front edges of the legs during the insertion of the LED leads.

The mounting structure 20 has the further advantage that it is easily modified to produce LED mounting structures with substantially less height than the ones shown and described so far.

Referring to FIG. 10, the dashed line 103 shows approximately where the lower portion of the leg is cut in order to form a foot attached to the leg for a LED mounting structure of approximately half the height of the one shown in full lines in FIG. 10. Such a structure is advantageous not only in that is raises the LED off the surface of the board somewhat, but also in that it extends the LED a substantial distance laterally from the mounting feet, thus enabling the light-emitting portion of the structure to extend over the blank marginal area of a circuit board.

Figure 11:
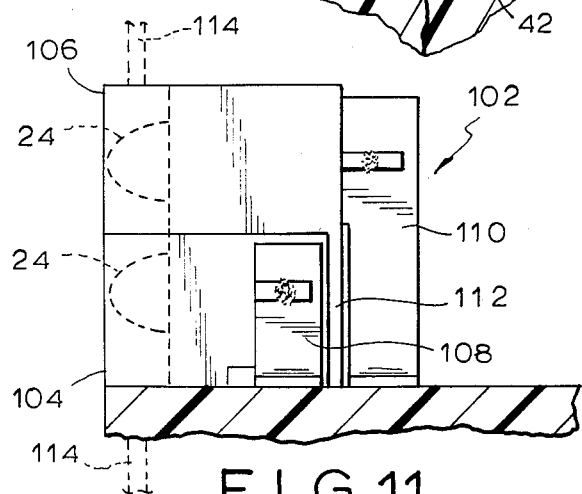
FIG. 11 is a side elevation view illustrating another embodiment of the invention.

FIG. 11 shows such a short LED mounting structure 104 attached to the printed circuit board 44. Also attached is a modified mounting structure 106 which is adapted to fit over the device 104 so that the two LEDs are mounted on the printed circuit board piggy-back fashion. The structure 104 has relatively short conductive mounting legs 108, and the structure 106 has longer legs 110 and an insulating barrier 112 between the legs 108 and 110.

The indicator lamp mounting structures are particularly advantageous when the ends of the LED mounting structures extend through panels such as the panel 114 shown in dashed lines in FIGS. 11 and 4, as well as in solid lines in FIG. 2.

It can be seen that the invention fully satisfies the objectives set forth above. The indicator lamp mounting structure secures the lamp solidly to printed circuit boards, even surface mount boards, without the use of through holes. The device provides relatively broad mounting feet which are accurately space from one another and accurately aligned in the same plane with one another and with the bottom surface of the housing. The accuracy of these dimensions make the device particularly valuable for use in surface mount technology.

The mounting structure of the invention is compact, and yet allows the indicator lamp to extend to a height above the board surface where it can be more readily seen, and allows it to extend right up to the edge or even beyond the edge of the printed circuit board.

The manufacturing method is economical and fast, and is advantageous in that it maintains the co-planarity of the mounting feet and the precise spacing of the legs throughout the manufacturing process.

While the present invention has been particularly shown and described with reference to preferred embodiments, various changes and modifications in form and details may be made without departing from the spirit and scope of the invention. It is intended that the appended claims be interpreted as including the foregoing as well as various other changes and modifications.

I claim:

1. A mounting structure for securing an indicator lamp to a printed circuit board at a position elevated above the surface os said board, said structure comprising, in combination a pair of electrically conductive support legs, each of said legs having a relatively broad foot at one end, said foot being adapted to be secured to said board in electrically conductive contact with an electrically conductivbe area on said board, a lamp holding body secured to said legs, said lamp having a holding structure, a light-emitting element mounted in said holding structure, and a pair of electrical leads, said lamp being mounted in said body, and each of said leads being electricvally conductively connected to one of said legs.

2. A structure as in claim 1 in which said lamp is a light-emitting diode.

3. A structure as in claim 1 in which said legs extend in a first direction transverse to the plane of said board, said lamp being adapted to shine light in a principal direction, said lamp being mounted in said body so that said direction is substantially parallel to said plane of said board.

4. A structure as in claim 3 in which a portion of said body is electrically insulating and extends laterally from said legs in a direction transverse to said first direction and contacts the surface of said board when said structure is secured to said board.

5. A structure as in claim 1 in which said legs are generally L-shaped and have fastening projections, said body is made of a deformable plastic material and has recesses for receiving said fastening projection, and said projections being fitted into said recesses.

6. A structure as in claim 1 in which said circuit board is a surface mount board substantially without through holes.

7. A structure as in claim 1 in which said leads are connected to said legs by fastening means resistant to loosening at solder melting temperatures.

8. A structure as in claim 7 in which said fastening means comprises a welded joint.

9. A structure as in claim 1 in which said lamp is recessed in said body to shield it from breakage.

10. A structure as in claim 1 in which said body has a generally rectangular outline for ease in squaring of the body by automatic locating devices for securing said structure to said board.

11. A LED support structure for securing a LED indicator adjacent one edge of a printed circuit board, said support structure comprising, in combination, an electrically insulating support body, a LED mounted in said body adjacent one end of said body, said LED having electrically conductive leads, a pair of electrically conductive feet secured to said body at the end of said body opposite said one end, each of said feet having a substantial surface area to be secured to an electrically conductive area on said board, each of said leads being electrically connected to one of said feet, whereby said feet can be secured to said board inwardly from said edge while LED is located near said edge, said LED being positioned to emit light in a principal direction substantially parallel to said board when mounted on said board.

12. A structure as in claim 11 including a leg extending from each of said feet, each of said leads extending through said body and into contact with one of said legs, said body and said feet contacting said board when said structure is mounted on said board.

13. A structure as in claim 12 in which said legs have fastened prongs and said body has holes for receiving said prongs, said prongs being fitted into said holes to secure said legs and feet to said body.

14. A structure as in claim 11 in which said feet are coated with solder to facilitate connection to said conductive areas on said circuit obard.

15. A structure as in claim 12 in which said legs and said body are dimensioned and adapted to fit over another of said structures so that said structures can be mounted on a circuit board in piggy-back fashion, with the body of said other structure being underneath the body of the first-named structure, and with the feet of both bodies contacting said board when said bodies are mounted on said board.

16. An array consisting of a plurality of printed circuit boards mounted parallel to one another with at least one edge of each aligned with the corresponding edge of the other an LED mounting structure structure mounted on each of said boards adjacent said one edge, said mounting structure comprising, in combination, a pair of electrically conductive support legs, each of said legs having a relatively broad foot at one end, said foot being adapted to be secured to said board in electrically conductive contact with an electrically conductive area on said board, a LED holding body secured to said legs, said LED having a holding structure, a light-emitting element mounted in said body, and a pair of electrical leads, said LED being mounted in said body, and each of said leads being electrically conductively connected to one of said legs, said legs extending in a first direction transverse to the plane of said board, said LED being adapted to shine light in a principal direction which is substantially parallel to said plane of said board, whereby the LEDs mounted on the boards are readily visible from a relatively wide scope of viewing angles.

17. A method of manufacturing printed circuit board-mountable indicator light assemblies, said method comprising the steps of:
  (a) providing an indicator light source having a body with a light-emitting element mounted in it, and a pair of electrically conductive leads;
  (b) providing an elongated strip of electrically conductive material;
  (c) forming from the material of said strip spaced pairs of connection legs, the legs of each pair being interconnected by a portion of the strip;
  (d) securing an electrically insulating housing body to said legs while said legs are interconnected;
  (e) partially enclosing said body of said light source in said housing body;
  (f) connecting said leads of said light source to said legs so that said legs serve as leads for said light source and supports for said assembly.

18. A method as in claim 17 in which said legs have prongs and said body has holes to receive said prongs, said securing step comprising forcing said prongs into said holes.

19. A method as in claim 17 in which said light source is a LED with leads, said connecting step including spot-welding said leads of said LED to said legs.

20. A method as in claim 17 including bending said legs to form feet at the ends while said legs are interconnected, and including the step of providing a locally weakened attachment structure at the junction of said assembly and said strip, and breaking said assembly off from said strip at the location of said weakened structure.

* * * * *